(12) United States Patent
Kanesashi

(10) Patent No.: US 7,077,665 B2
(45) Date of Patent: Jul. 18, 2006

(54) CONTACT PIN AND SOCKET FOR ELECTRICAL PARTS

(75) Inventor: Hokuto Kanesashi, Kawaguchi (JP)

(73) Assignee: Enplas Corporation, Saitama (JP)

( * ) Notice: Subject to any disclaimer, the term of this patent is extended or adjusted under 35 U.S.C. 154(b) by 113 days.

(21) Appl. No.: 10/390,668

(22) Filed: Mar. 19, 2003

(65) Prior Publication Data

US 2003/0181076 A1  Sep. 25, 2003

(30) Foreign Application Priority Data

Mar. 19, 2002 (JP) .............................. 2002-075545
Mar. 19, 2002 (JP) .............................. 2002-075923
Mar. 19, 2002 (JP) .............................. 2002-075947

(51) Int. Cl.
*H01R 25/00* (2006.01)

(52) U.S. Cl. ........................................ 439/73; 439/289

(58) Field of Classification Search ................. 439/73, 439/70, 71, 525, 66, 331, 289, 418
See application file for complete search history.

(56) References Cited

U.S. PATENT DOCUMENTS

| | | | | |
|---|---|---|---|---|
| 4,634,199 A | * | 1/1987 | Anhalt et al. ................. | 439/69 |
| 5,247,250 A | * | 9/1993 | Rios ............................. | 439/70 |
| 5,688,128 A | * | 11/1997 | Ikeya ........................... | 439/73 |
| 5,772,449 A | * | 6/1998 | Feldmeier et al. ............ | 439/66 |
| 5,879,168 A | * | 3/1999 | Chan et al. ................... | 439/66 |
| 6,017,240 A | * | 1/2000 | Belopolsky et al. ......... | 439/418 |
| 6,024,579 A | * | 2/2000 | Bennett ........................ | 439/66 |
| 6,038,130 A | * | 3/2000 | Boeck et al. ................ | 439/289 |
| 6,152,744 A | * | 11/2000 | Maeda ......................... | 439/71 |
| 6,200,151 B1 | * | 3/2001 | Kaneko ....................... | 439/289 |
| 6,290,524 B1 | * | 9/2001 | Simmel ....................... | 439/289 |
| 6,575,767 B1 | * | 6/2003 | Satoh et al. .................. | 439/71 |
| 6,585,527 B1 | * | 7/2003 | Koopman et al. ............ | 439/71 |
| 6,794,890 B1 | * | 9/2004 | Tokumo et al. ............. | 324/761 |

* cited by examiner

*Primary Examiner*—Tho D. Ta
(74) *Attorney, Agent, or Firm*—Staas & Halsey LLP

(57) ABSTRACT

A contact pin made of an electroconductive plate comprising a contact portion formed at a first end edge portion of the plate, the upper end contact portion being designed to electrically connect a part and having a central portion protruded to be an arcuate shape, the central portion being designed to abut against the part to establish an electrical connection between the central portion and the part. A socket for en electrical part comprises a base having the contact pin mentioned above, an intermediate connector provided on the base for establishing an electrical connection between the contact pin and the terminal of the electrical part. The intermediate connector has a connecting electrode which is electrically connected with the contact pin.

34 Claims, 10 Drawing Sheets

PRIOR ART

PRIOR ART

CONTACT PIN AND SOCKET FOR ELECTRICAL PARTS

BACKGROUND OF THE INVENTION

1. Field of the Invention

The present invention relates to a contact pin for a socket for electrical parts, and the socket for electrical parts, which is used for establishing an electrical connection between a semiconductor device (hereinlater called an IC package) or the like and a printed circuit board, by detachably holding the semiconductor device.

2. Related Art

As a conventional "socket for electrical parts" of this kind, there is provided, for example, an IC socket, as shown in FIGS. 10 to 12 that are described in Japan unexamined Laid-opened patent publication No. A-242977/1999.

The conventional IC socket 11, as shown in FIG. 10, is designed to be mounted on a printed circuit board 12 and to electrically connect an IC package 13 as "electrical parts" and the printed circuit board by holding the IC package 13 on the socket.

The IC socket 11 has a base plate 14, a tab film 15, a ball guide 16 and a pressing jig 17, in this order from the bottom. And these parts are detachably assembled by using a bolt 18 and a nut 19.

The base plate 14, as shown in FIG. 10, is formed to be a plate having a quadrangular shape, and at a peripheral portion of its 4 sides thereof, a plurality of round type pins 14a lines up in two lines. Inner side of the lines of the round pins, 4 bolt holes 14b, 4 positioning holes 14c are provided, and an elastic member 14d made of silicon rubber having elasticity is provided at a central portion of the base plate. The round pin 14a, as shown in FIGS. 10 and 11, passes through the base plate 14 and is provided with a fitting concave portion 14e at its upper portion. At a lower portion of the round pin 14a, an inserting portion 14f which protrudes downward from an under surface of the base plate 14 is provided and designed to be electrically connected to the printed circuit board by being inserted into a through hole 12a of the printed circuit board 12.

In addition, a tab film 15, as shown in FIGS. 10 and 11, is formed to be a thin sheet having a quadrangular shape and a size similar to the base plate 14. The tab film has, on its upper surface opposite to the IC package 13, an electrode pattern 15a for establishing connection with a set of arrangement of terminals 13a of the IC package 13 and has, on its lower surface opposite to the base plate 14, a pin type terminal 15b for establishing connection with the base plate 14. The tab film also has a conducting wire connecting the pin type terminal 15b and the electrode pattern 15a.

The pin type terminal 15b is structured to be inserted into a fitting concave portion 14e of the round pin 14a of the base plate 14. In addition, the tab film 15 has also a bolt hole 15c and a positioning hole 15d having a size and at a position corresponding to the holes of the base plate 14 etc.

Further, the ball guide 16, as shown in FIGS. 10 and 11, is made of an electrical insulating material and has a quadrangular plate like shape having a size similar to a pressing jig body 20 of the pressing jig 17. At a central portion of the ball guide 16, a positioning opening 16a is provided for positioning a periphery of the solder ball 13a of the IC package 13. And at a position corresponding to the bolt hole 15c and the positioning hole 15d, a bolt hole 16b and a positioning hole 16c have a similar size to the corresponding bolt and the positioning holes (15c and 15d) of the tab film 15. The positioning opening 16a, as shown in FIG. 12, positions the balls 13a which are arranged at the outermost periphery of the matrix-like set of the solder ball arrangement.

Further, the pressing jig 17, as shown in FIG. 11, has the pressing jig body 20 having a quadrangular shape frame, a cover member 21 rotatably attached to the pressing jig body 20 through an axis 22, and a spring 29 urging the cover member 21 in an opening direction of the cover member 21 (clockwise in FIG. 11). A pusher member 23 for pressing the IC package 13 is attached through an axis 30 on the cover member 21 in a swinging manner. The pusher is urged by a spring 28 in a direction away from the cover member 21. Further, on the cover member 21 an engaged portion 24 is provided, and a latch member 25, which is designed to engage with the engaged portion 24, is provided through an axis 26 rotatably on the pressing jig body 20. The latch member 25 is urged clockwise in FIG. 12 (in an engaging direction) by the spring 27.

Into the pressing jig body 20, as shown in FIGS. 11 and 12, the IC package 13 having a quadrangular shape is designed to be inserted and be mounted on the tab film 15. From an under surface portion of the pressing jig body 20, a positioning pin 20a protrudes downward to be fitted into the positioning holes 14c, 15d and 16c. Further, in the pressing jig body 20, as shown in FIG. 12, a bolt hole 20b having the same size as the size of the bolt hole 16b of the ball guide 16 is provided at a place correspondent to the bolt hole 16b.

The positioning pin 20a of the pressing jig body 20 is, as shown in FIG. 11, fitted into each positioning hole 14c, 15d and 16c of the base plate 14, the tab film 15 and the ball guide 16 so that each member is assembled in a predetermined positional relationship. And then into each bolt hole 14b, 15c, 16b and 20b of the base plate 14, the tab film 15, the ball guide 16 and the pressing jig body 20, the bolt 18 is inserted and screwed up together with the nut 19, to put all these parts on one another.

In such a socket mentioned above, when the IC package 13 is accommodated on the IC socket 11, as shown in FIG. 12, the outer periphery of the IC package 13 is guided to be positioned by an inner surface of the quadrangular frame-like pressing jig body 20 and also the solder ball 13a of the IC package 13 is guided and positioned by the ball guide 16.

An upper surface of the peripheral portion of the thus positioned IC package 13 is then pressed by the pusher member 23, as shown in FIG. 12.

However, in such a conventional socket, the fitting concave portion 14e of the round pin 14a of the base plate 14 is designed to be fitted to the pin type terminal 15b of the tab film 15 as an intermediate connector, being poor in workability of producing the round pin 14a having the fitting concave portion 14e and in workability of assembling and disassembling of the tab film 15. And as there is a need to bring the pin type terminal 15b into a fitting state, it is necessary to make the outer diameter of the round pin 14a larger, being inconvenient in realizing a socket having a narrower pitch of the round pins arrangement and consequently difficult in downsizing the IC socket 11.

In addition, as the IC package 13 is guided and positioned mainly by the pressing jig body 20, the pressing jig 17 must be replaced with another one so as to accommodate another IC package having a different size.

Further, the pusher member 23 is designed to press the IC package 13 in order to press the solder ball 13a on the tab film 15 so that when the pressing force becomes large, the solder ball 13a is excessively deformed in its shape.

There is another conventional IC socket other than the one mentioned above, which is designed to make contact between the under surface of the solder ball and the upper end portion of the contact pin. The contact pin, however, abuts strongly against the solder ball when the IC package is pushed with larger force, so that there is still a problem that the solder ball can be damaged.

SUMMARY OF THE INVENTION

An object of the present invention is to substantially eliminate defects or drawbacks encountered in the related art mentioned above and to provide a contact pin for a socket for electrical parts and the socket for electrical parts capable of assembling and disassembling an intermediate connector easily and of realizing downsizing of the socket for electrical parts.

Another object of the present invention is to provide an IC socket which can be used for various IC packages having different sizes without replacing such a big part as a pressing jig with another one.

Still another object of the present invention is to provide a socket for electrical parts capable of preventing a terminal of the electrical part from being excessively deformed or damaged in shape.

These objects can be achieved in line with the aspects described below. A first aspect of the present invention can be achieved by providing a contact pin made of an electro-conductive plate comprising a contact portion formed at a first end edge portion of the plate, the contact portion being designed to electrically connect a part and having a central portion protruded to be an arcuate shape, the central portion being designed to abut against the part to establish an electrical connection between the central portion and the part.

A second aspect of the present invention can be achieved by providing a socket for an electrical part comprising;

the contact pin according to the first aspect mentioned above, the contact pin further comprising a lead portion formed at a second end portion of the plate, the contact pin being provided to the electrical insulating member, the contact portion of the contact pin being protruded from the first surface of the electrically insulating member, the lead portion of the contact pin being protruded from the second surface of the electrically insulating member and designed to establish an electrical connection between the lead portion and the printed circuit board.

A third aspect of the present invention is characterized in that a socket for an electrical part comprising:

the contact pin according to the first aspect mentioned above;

a base in which the contact pin according to the first aspect is provided;

an intermediate connector, provided on the base, for establishing an electrical connection between a terminal of the electrical part and the contact pin, the intermediate connector having a connecting electrode, on a first surface of the intermediate connector, for establishing an electrical connection with a contact portion of the contact pin;

a body provided on the intermediate connector;

a fixing means for fixing the base, the intermediate connector and the body, wherein at the time the base, the intermediate connector and the body are fixed together by the fixing means, the connecting electrode and the contact portion of the contact pin are elastically abutted with each other.

A fourth aspect of the present invention can be achieved by a socket for an electrical part comprising:

a socket body in which an electrical part is accommodated; and the contact pin, according to the first aspect, provided in the socket body, wherein a contact portion of the contact pin is designed to abut against a terminal of the electrical part.

According to these aspects of the present invention, at the first end edge portion of the plate member having electro-conductivity, the contact portion for establishing an electrical connection with the other part is formed. The contact portion is formed to be a protruded arcuate shape in the central portion of the contact portion. And the arcuate central portion is designed to abut against other part to establish an electrical connection. Therefore apart from the conventional round pin 14a, the contact pin of the present invention can be produced easily and at a low cost as well. As the contact portion of the contact pin is formed to be an arcuate protruded shape at the central portion of the contact portion, the contact portion can be made not sharpened. Therefore the other part (for example a connecting electrode 35b of the tab film 35) can be prevented from being damaged caused by abutting against the contact portion of the contact pin. In addition, the pitch of the connecting electrodes 35b arrangement can be made narrower, realizing downsizing of the IC socket itself. Furthermore, the contact portion of the contact pin of the present invention is only abutted against the connecting electrode of the intermediate connector so that the conventional fitting process can be eliminated. And assembling and disassembling of the intermediate connector can be carried out much easier.

Other objects can be achieved in line with the aspects described below.

A fifth aspect of the present invention is characterized in that a socket for an electrical part comprising:

a base on which a connecting member is provided;

an intermediate connector for establishing electrical connection between a terminal of the electrical part and the connecting member;

a body detachably provided on the intermediate connector with respect to the base; and an alignment member which is detachably engaged with the body and has an opening portion in its central portion in which the electrical part is accommodated, wherein a plurality of alignment members are previously prepared and used interchangeably in accordance with a dimension of an outer diameter of an electrical part to be tested.

A sixth aspect of the present invention is characterized in that in addition to the fifth aspect, the socket further comprises:

a cover member detachably attached to an end portion of the body; and a press member detachably provided to the cover member, the press member having a press surface for pressing the electrical part, wherein a plurality of press members are previously prepared and can be used interchangeably in accordance with a dimension of an outer diameter of the electrical part.

A seventh aspect of the present invention is characterized in that in addition to the sixth aspect, the socket further comprises:

a slanted guide surface provided on an upper portion of an opening portion of the alignment member, the slanted guide surface being designed to guide the electrical part; and a positioning surface provided on a lower portion of the opening portion continuously downward from the guide surface for positioning the electrical part.

According to the another aspect of the present invention mentioned above, as the socket for the electrical part has a base having a connecting member;

an intermediate connector for establishing an electrical connection between a terminal of the electrical part and a connecting member;

a body detachably provided, with respect to the base, on the intermediate connector;

an alignment member detachably provided on the body, the electrical part being accommodated in the opening portion formed at a central portion of the alignment member. And a plurality of alignment members having different dimensions of the opening portion with respect to the different outer diameters of the electrical part are previously provided and can be used interchangeably in accordance with a dimension of an outer diameter of the electrical part. Therefore the socket of the present invention can be used for various IC packages having different outer diameter by only interchangeably replacing the alignment with another one, being able to carry out an electrical performance test for various IC packages having different outer diameter without replacing the body itself.

Furthermore, according to the another aspect of the present invention mentioned above, as the socket for the electrical part has a cover member rotatably attached on an end portion of the body;

a press member detachably provided to the cover member, the press member having a press surface for pressing the electrical part. And a plurality of press members are previously prepared and can be used interchangeably in accordance with a dimension of an outer diameter of the electrical part.

Therefore, the socket of the present invention can be used for various IC packages having different outer diameter by only replacing both the alignment member and the press member with another ones. Therefore, electrical performance test for various IC packages having different outer diameter can be carried out without replacing the body on which the cover member is rotatably attached.

Those still another object can be achieved in line with the aspects described below.

An eighth aspect of the present invention is characterized in that a socket for an electrical part comprising:

an accommodation surface on which the electrical part having terminals on a first surface of a body of the electrical part is accommodated;

a contact terminal disposed on the accommodation surface, which is designed to contact the terminal of the electrical part;

a press member for pressing the electrical part placed on the accommodation surface to establish an electrical connection between the terminal of the electrical part and the contact terminal; and an electrically insulating stopper interposed between the first surface of the electrical part and the accommodation surface, wherein the stopper limits the deformation of the terminal when the press member presses the electrical part.

A ninth aspect of the present invention is characterized in that in addition to the eighth aspect, the accommodation surface is a surface of a sheet-like connector on which an electrode pattern is provided as the contact terminal, and the stopper is interposed between the connector and the first surface of the electrical part.

A tenth aspect of the present invention is characterized in that in addition to the eighth and the ninth aspects, the stopper is formed to be a sheet-like shape, and a plurality of openings, into which the terminal of the electrical part is inserted, is provided to the stopper.

Other aspect of the present invention are as follows. The stopper is made of polyimide resin by molding. The opening of the sheet-like stopper controls the side surface portion of the terminal. The electrical part is a BGA package and the terminal is a solder ball.

According to the aspect mentioned above, excessive deformation or damages of the terminal of the electrical part can be prevented because the stopper is interposed between the first surface of the part body and the accommodation surface. Further, when the stopper having different thickness is used, various electrical parts having different size of terminals can be used.

In addition, excessive deformation of the terminal of the electrical part can be further prevented if a plurality of openings is formed in the sheet-like stopper and each terminal is inserted into each opening, respectively.

When the stopper is molded of polyimide resin, manufacturing process can be carried out with higher precision using laser beam processing etc. And the burn-in test of the electrical parts can be safely carried out because of the good heat resistance of the polyimide resin. Also polyimide resin is high in its hardness, preventing effectively deformation of the terminal of the electrical part at the time of testing.

Further, the side surface of the terminal is used for positioning of the electrical part, being able to position the electrical part more accurately.

The nature and further characteristic features of the present invention will be made more clear from the following descriptions made with reference to the accompanying drawings.

BRIEF DESCRIPTION OF THE DRAWINGS

In the accompanying drawings:

FIG. 9A is a front view and FIG. 9B is a bottom view of the IC package, respectively;

DETAILED DESCRIPTION

A preferred embodiment of the present invention will be described hereunder with reference to the accompanying drawings.

Further it is to be noted that the terms "upper", "lower", "vertical", "horizontal" and the like described herein are used in the illustrated state or usable state of the socket or members associated herewith and also that a number of contact pins, terminals and some other parts are actually arranged, though the description may be made with reference to single one thereof for the sake of easy understanding of the present invention.

FIGS. 1 to 9 show an embodiment of the present invention.

Numeral number 31 is an IC socket as a "socket for electrical part" to be disposed on a printed circuit board (not shown). An IC package 33 as an "electrical part" is held in the IC socket 31 so as to establish an electrical connection between the IC package 33 and the printed circuit board.

Figure 9A:
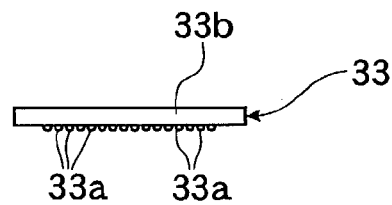
FIG. 9A and FIG. 9B is a view of an IC package.
Figure 9B:
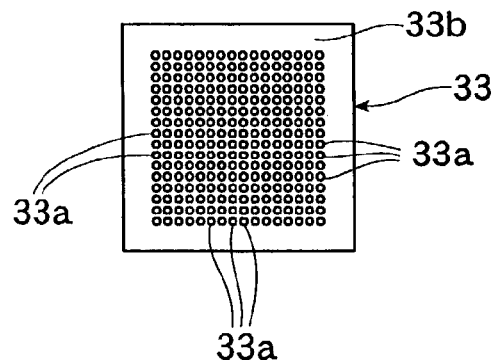

The IC package 33 is, as shown in FIG. 9, what is called a BGA (Ball Grid Array) package having a quadrangular shaped package body (part body) 33b and a plurality of approximately spherical solder ball 33a (terminal) on an under surface (on a first surface) thereof. These solder balls are arranged in a matrix like manner having columns and rows.

Figure 1:
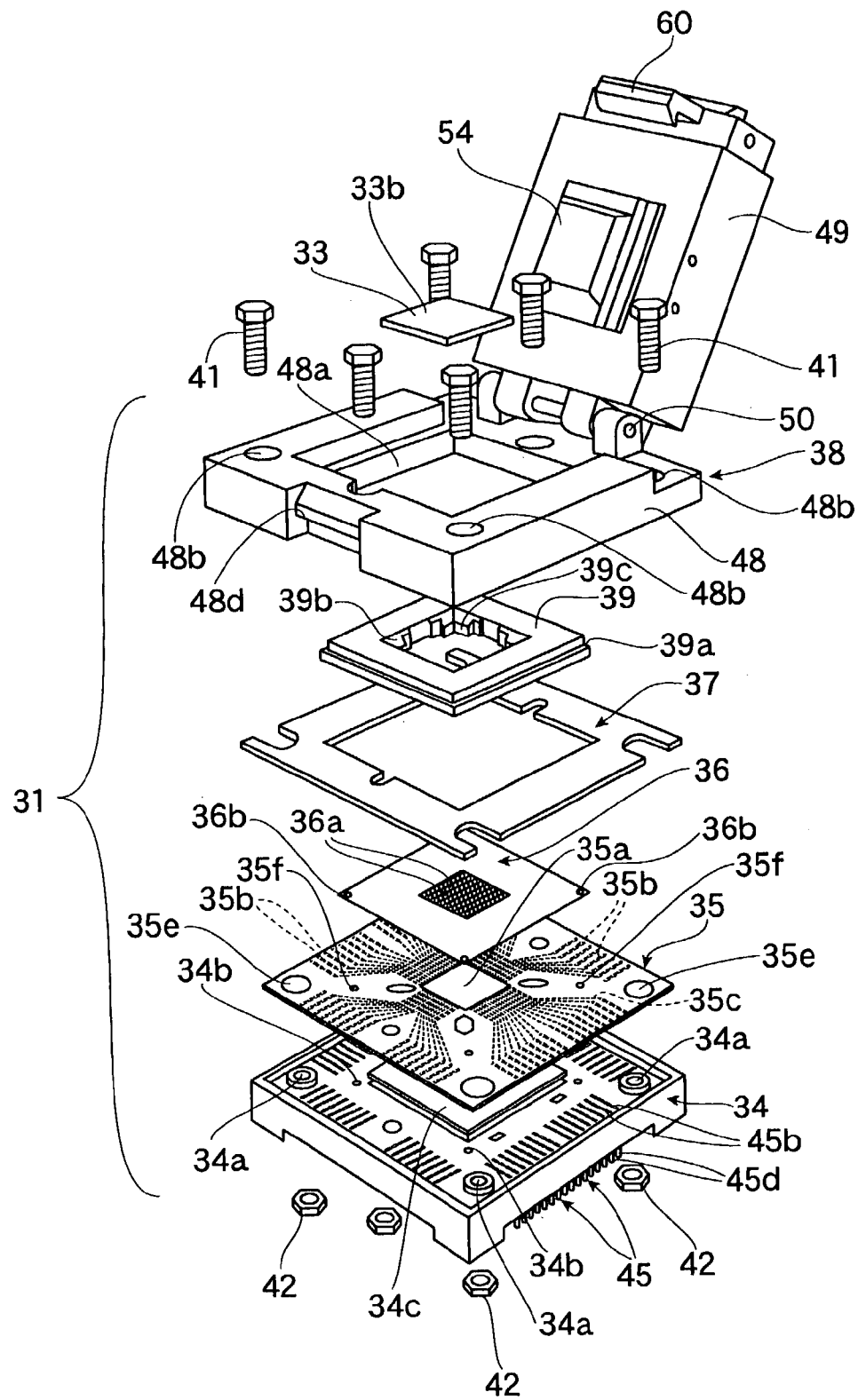
FIG. 1 is an exploded perspective view according to one embodiment of an IC socket of the present invention.

The IC socket 31 has, as shown in FIG. 1 etc, a base plate (base) 34, a tab film 35 as a "connector", a stopper 36, an elastic member 37, a pressing jig (pressing means) 38 and an alignment plate 39 as an "alignment member". These members or parts are assembled and detachably fixed by a bolt 41 and a nut 42 as an "attaching means (fixing means)".

Figure 3:
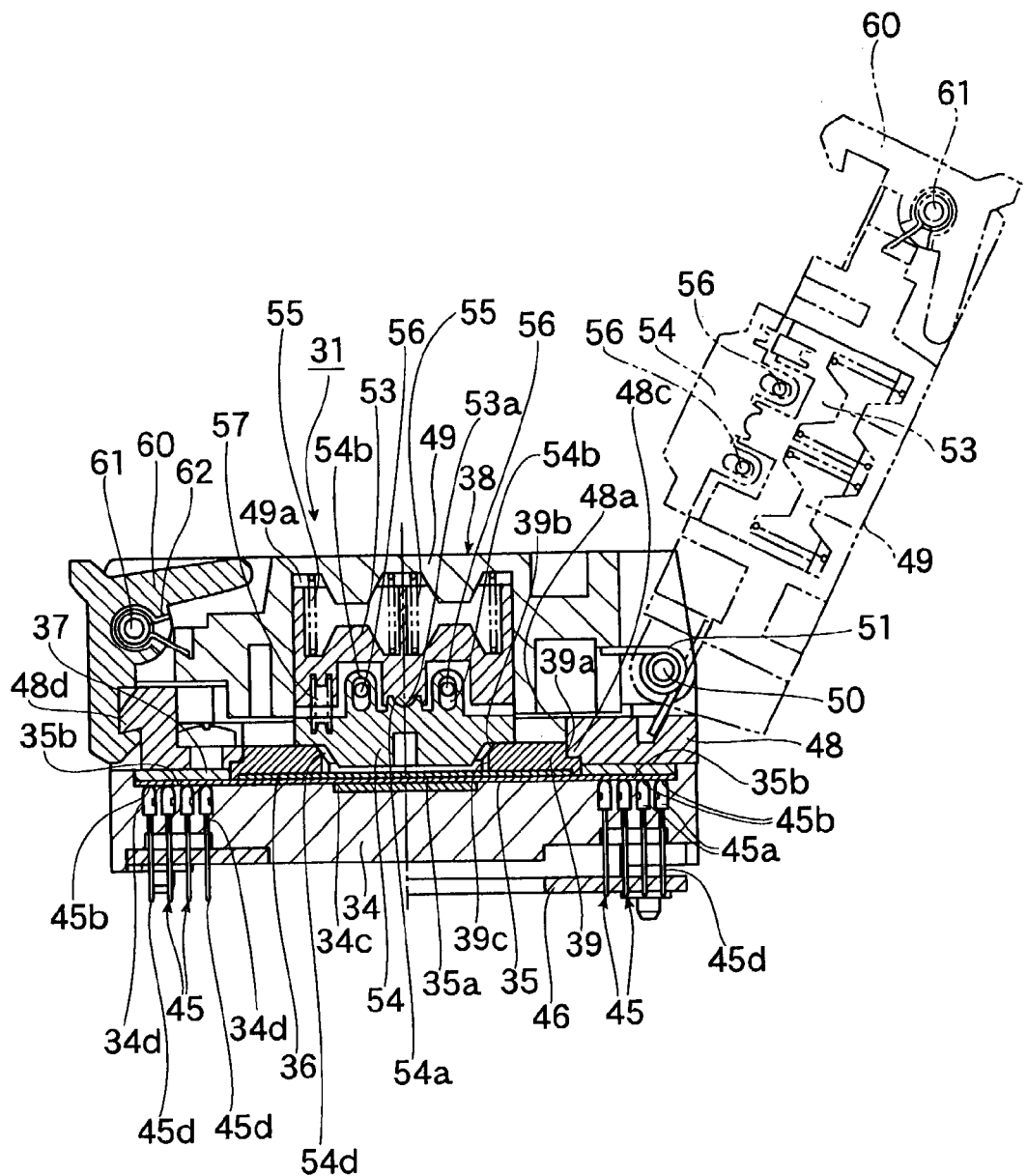
FIG. 3 is a sectional view of the IC socket of FIG. 1.

The base plate 34 is, as shown in FIGS. 1 and 3, a quadrangular-shaped plate and has a plurality of contact pins (connecting members) 45 at its 4 sides peripheral portions. These contact pins are arranged in 4 lines as shown in FIGS. 1 and 3. In the base plate 34, a plurality of bolt holes 34a and positioning holes 34b are formed. And at a central portion of the base plate, a quadrangular plate-like elastic member 34c made of quadrangular plate-like silicone rubber is provided.

Figure 6:
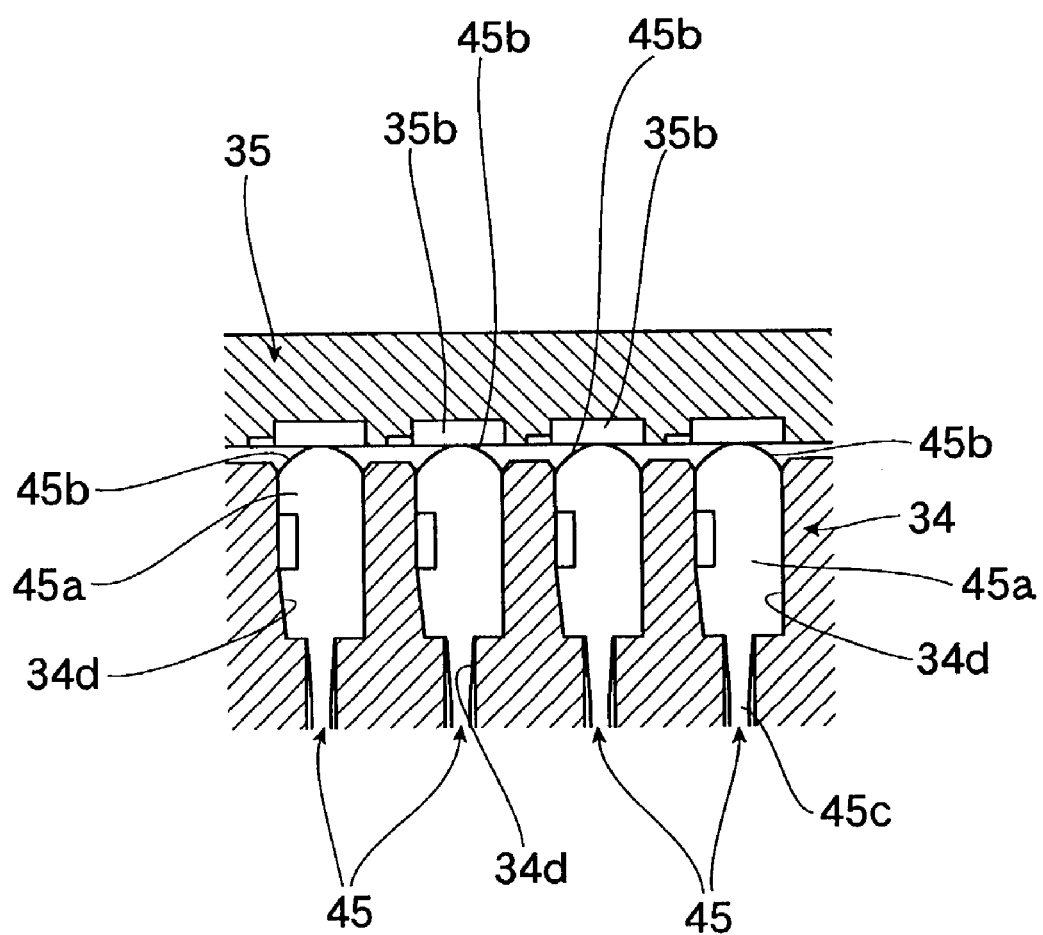
FIG. 6 is an enlarged sectional view showing a connecting state between a connecting electrode and a contact pin of the IC socket of FIG. 1.
Figure 7:
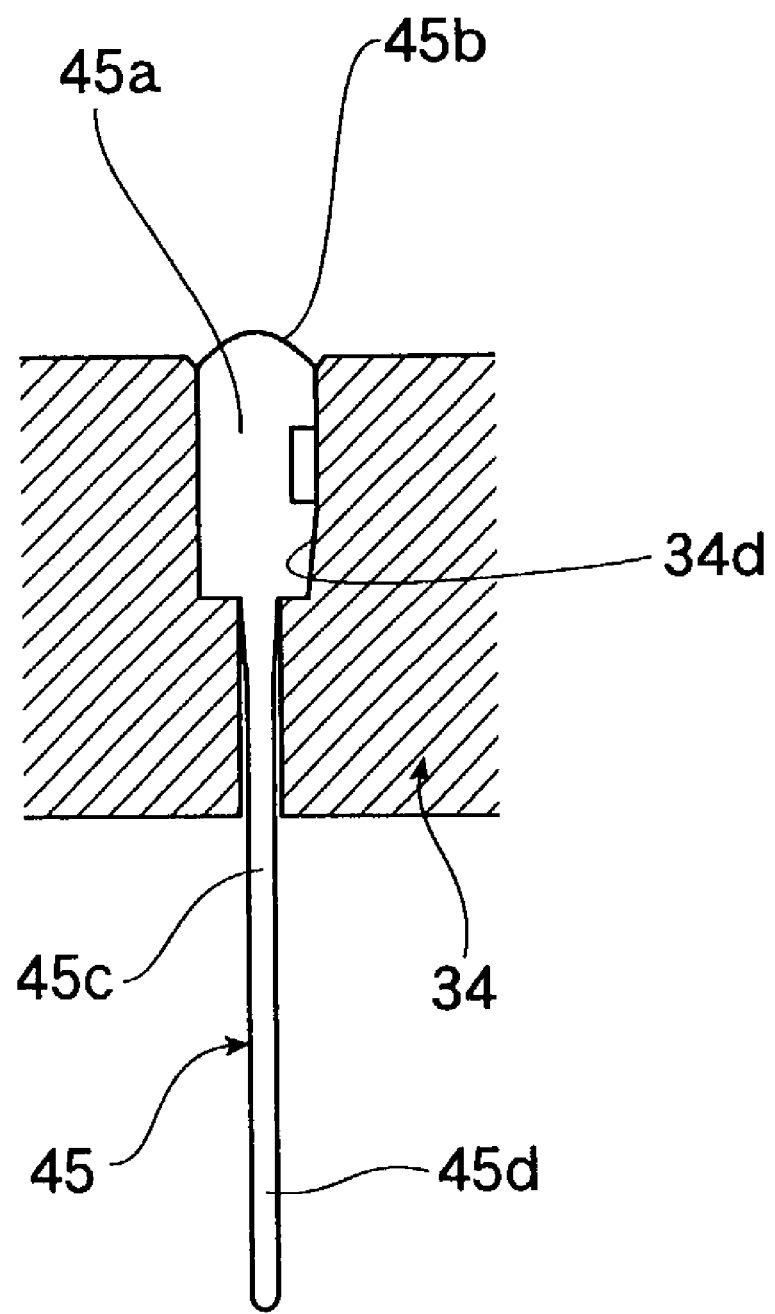
FIG. 7 is a front view of a contact pin used in FIG. 1.

The contact pin 45 is formed to be a long plate-like shape as shown in FIG. 7 and made of an electroconductive metal plate through press working. More in detail, the contact pin 45 has an upper portion 45a which is made wider in its upper portion and is press-fitted into a through hole 34d of the base plate 34. On an "upper end edge portion of the upper portion 45a" or the "first end edge portion" of the contact pin 45, an upper end contact portion 45b is formed for establishing a contact with the tab film 35. At the upper end contact portion 45b, as shown in FIGS. 6 and 7, an arcuate central portion is formed to be a protruding shape protruding upward beyond the upper surface of the base plate 34. Further, a lower side portion 45c of the contact pin 45, which is positioned at a place lower than the wide upper portion 45a and is formed to have a narrower width than that of the upper portion 45a, is passed through the through hole 34d of the base plate 34 and is protruded downward from the base plate 34. The lead portion 45d protruded downward is, as shown in FIG. 3, passed through the location board 46 and is inserted into a through hole of the printed circuit board (not shown) to establish an electrical connection thereto.

Figure 5:
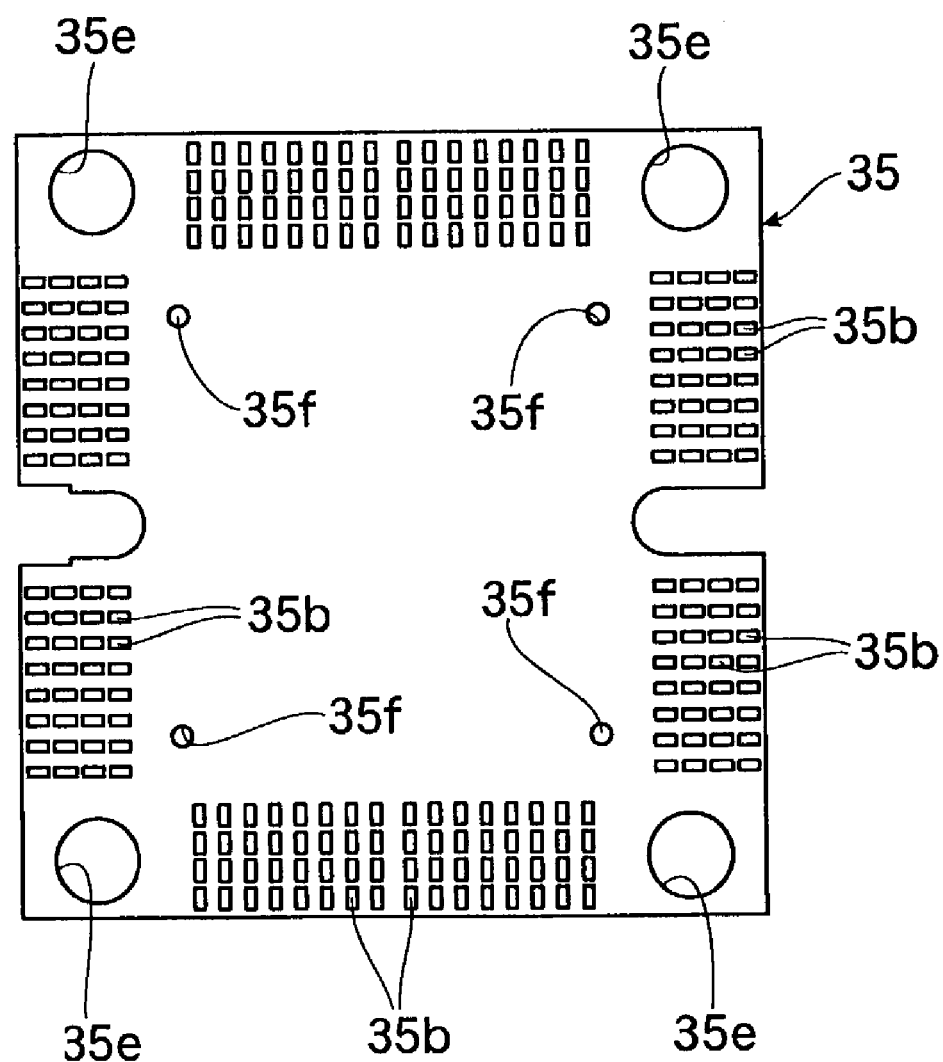
FIG. 5 is a bottom view of a tab film used in FIG. 1.

In addition, the tab film 35 has an accommodation surface on its upper surface to accommodate the IC package 33 and is formed to be a thin (film-like) sheet having a quadrangular shape of a size similar to the base plate 34. And the tab film 35 has, on the central portion of a first surface (upper surface) to be opposed to the IC package 33, as shown in FIG. 1, an electrode pattern 35a which abuts against a solder ball arrangement 33a of the IC package 33. On a peripheral portion of a second surface (rear surface) to be opposed to the base plate 34, the tab film 35 has, as shown in FIG. 5, a connecting electrode 35b which abuts against the contact pin 45. The connecting electrode 35b and the electrode pattern 35a are electrically connected by a conducting wire 35c.

The connecting electrodes 35b each have, as shown in FIG. 5, a long plate-like shape and are arranged in 4 lines in concert with the position of the contact pin 45. From each connecting electrode 35b, a conducting wire 35c is extended to be connected to the electrode pattern 35a. To each connecting electrode 35b, the arcuate-shaped central portion of the upper end contact portion 45b of the contact pins 45 is designed to abut to establish an electrical connection therebetween (see FIG. 6).

In the tab film 35, a bolt hole 35e and a positioning hole 35f having similar size and position to the holes of the base plate 34 etc. are formed (see FIG. 1).

Figure 4:
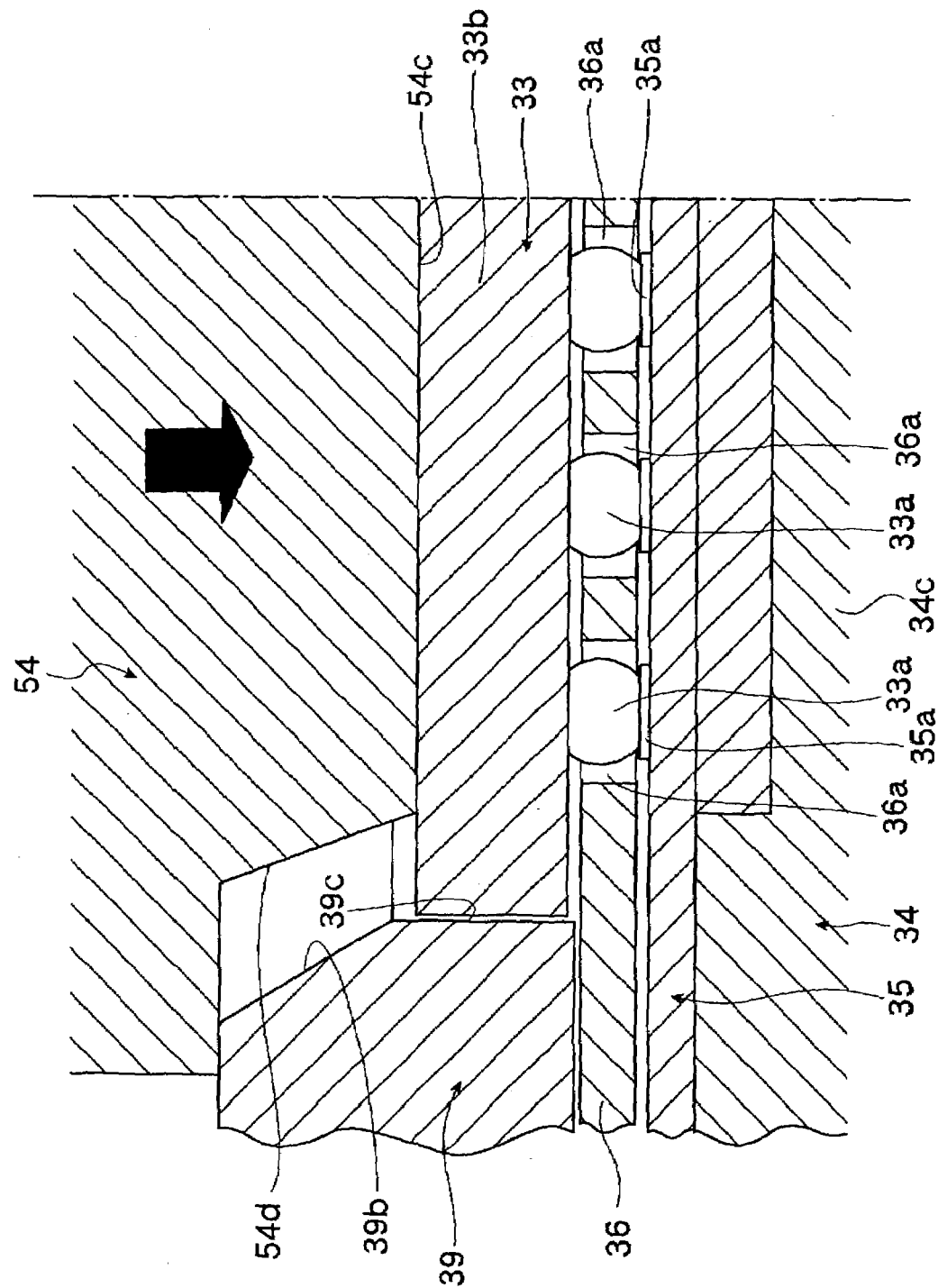
FIG. 4 is an enlarged sectional view of FIG. 1.
Figure 8:
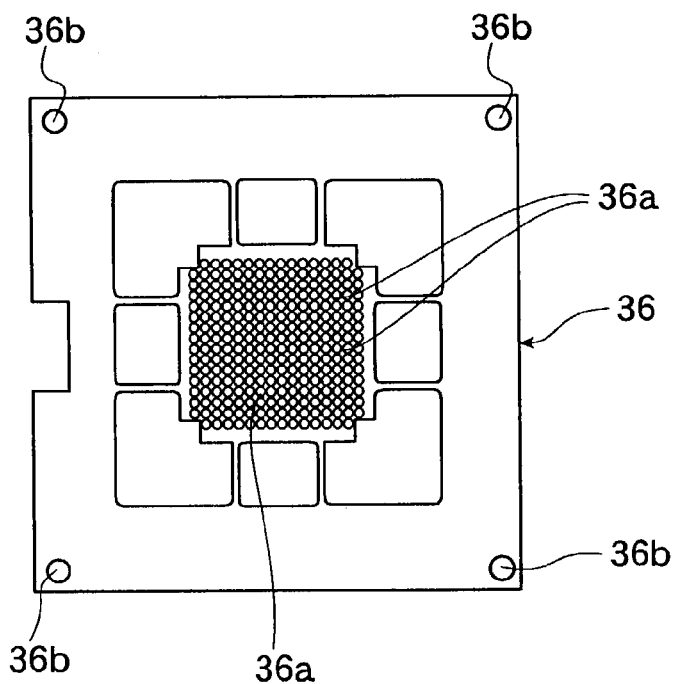
FIG. 8 is a plan view of a stopper used in FIG. 1.

Further, the stopper 36 is made of polyimide resin having heat resistance, electrical insulative property and a predetermined hardness and is formed to be a quadrangular shaped sheet as shown in FIG. 8. A plurality of solder ball openings 36a, into each of which each solder ball 33a is inserted, is formed. And a positioning hole 36b having similar size and position in concert with the size and position of the positioning hole 35f of the tab film 35 is formed. The stopper 36 has, as shown in FIG. 4, a thickness slightly thinner than the height of the ball of the solder ball 33a, and is interposed between an under surface of the package body 33b and an upper surface (accommodation surface) of the tab film 35. The stopper is designed to prevent the solder ball 33a from being deformed to an extent more than a predetermined value.

Further, the diameter of the solder ball opening 36a is designed to be slightly larger than that of the solder ball 33a so that the opening 36a can be used for positioning the side surface portion of the solder ball 33a and the solder ball 33a can be inserted into the opening 36a even if there is a certain variation in the dimension of the socket or electrical part.

Still further, as is shown in FIGS. 1 and 3, the elastic member 37 is formed to be a quadrangular frame-like sheet from a silicone rubber, and is disposed between a surface portion of the tab film 35 on which the connecting electrodes 35b is disposed and a frame-like pressing jig body 48 (which will be explained later) in a manner that the elastic member 37 is elastically deformed in a predetermined amount in a vertical (thickness) direction.

Further, as shown in FIGS. 1 and 3, the pressing jig 38 has the quadrangular frame-like pressing jig body 48 (body). A cover member 49 is rotatably attached to the pressing jig body 48 with an axis 50 and urged by a spring 51 in an opening direction (clockwise in FIG. 3) thereof.

Figure 2:
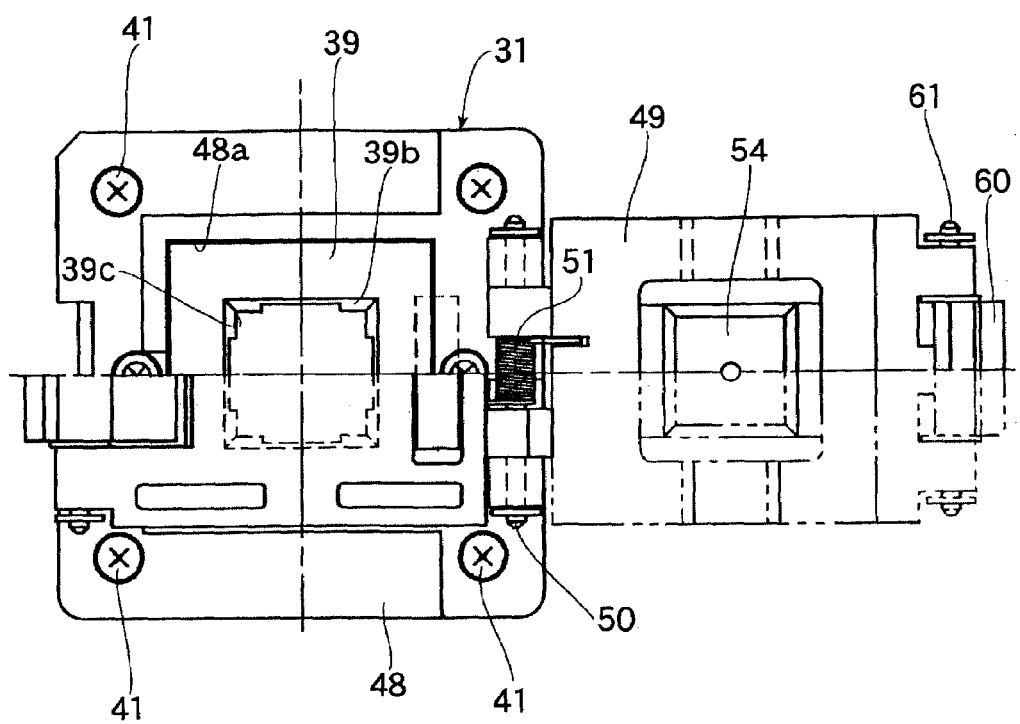
FIG. 2 is a plan view of the IC socket of FIG. 1.

The pressing jig body 48 has, as shown in FIGS. 1 to 3, an inner side opening 48a at an inner side thereof and also a plurality of bolt holes 48b into each of which the bolt 41 is inserted.

In addition, in the inner side opening 48a, the alignment plate 39 is detachably disposed. As shown in FIGS. 1 and 2, the alignment plate 39 has also a frame-like shape and is designed to accommodate the IC package 33 in the inner side opening portion in a condition that an outer peripheral surface of the IC package body 33b is positioned as shown in FIG. 4.

More specifically, as shown in FIGS. 1 and 3, a stepped portion 39a is formed on an outer peripheral portion of the alignment plate 39 and is designed to be engaged with an inner peripheral portion 48c formed at a lower portion of the pressing jig body 48 so that the alignment plate 39 can be detachably attached to the pressing jig body 48.

Further, at the upper side of the frame-like inner peripheral portion of the alignment plate 39, a tapered guide surface 39b is formed to guide the IC package 33. Also a positioning surface 39c is continuously provided vertically downward from the guide surface 39b so that IC package 33 is positioned and accommodated at a predetermined position after the IC package 33 is guided by the guide surface 39b.

On the other hand, as shown in FIG. 3, a pusher 53 for pressing the IC package 33 and a pad 54 as a "push member" are provided on the cover member 49. The pusher 53 is provided vertically movable, in FIG. 3, in a concave portion 49a of the cover member 49 and urged downward by a plurality of springs 55. The pusher 53 is also provided with a spherical surface-like protruded portion 53a at a central portion of an under surface portion thereof.

In addition, on the pad 54, a spherical surface-like concave portion 54a which abuts against the spherical surface-like protruded portion 53a is formed. And vertically extended ellipsoidal openings 54b are each formed at a position opposite to each other with respect to the concave portion 54a. Further, two axes 56 attached to the cover member 49 are each inserted into each ellipsoidal opening 54b so that the pad 54 is supported swingingly around an abutting portion as a center, at which the protruded portion 53a of the pusher 53 and the concave portion 54a abut each other. The axis 56 is detachably attached to the cover member 49 so that the pad 54 can be replaced with another by removing the axis 56 from its assembled position. Further, on the lower end portion of the pad 54, a push surface 54c having an approximately same size as the size of an upper surface of the IC package 33, is formed. The push surface 54c is, as shown in FIG. 4, formed to be smaller than the size of the inner opening (the inner opening is defined by the positioning surface 39c in a quadrangular manner). At an upper side, which is a side upper than the push surface 54c, a tapered surface 54d is formed continuously from an end portion of the push surface 54c in an approximately parallel to the guide surface 39b of the alignment plate 39.

Further, as shown in FIG. 3, between the pad 54 and the pusher 53, a spring 57 is provided at a side away from the axis 50 (right side in FIG. 3) and urges the pad 54 anti-clockwise in FIG. 3 with respect to the pusher 53.

Still further, as shown in FIG. 3, the pressing jig body 48 has an engaged portion 48d, and the cover member 49 has a latch member 60 which is designed to engage with the engaged portion 48d. The latch member 60 is rotatably provided on the cover member 49 by an axis 61 and is urged anti-clockwise (in an engaging direction) in FIG. 3 by a spring 62.

Moreover positioning pins (not shown) are each provided to protrude downward from the alignment plate 39 and are fitted into each positioning hole 34b, 35f and 36b of the base plate 34, tab film 35 and stopper 36, respectively, so that these members 34, 35 and 36 are assembled in a predetermined positional relation. The bolts 41 are each inserted into each bolt hole 34a, 35e and 48b of the base plate 34, tab film 35, and the pressing jig body 48, respectively, and are screwed up together with the nuts 42 so as to put all these members on one another.

In addition, the elastic member 34c placed at a central portion of the base plate 34 is disposed at an area corresponding to a pressed area of the tab film 35 where the set of solder balls 33a arrangement of the IC package 33 is pressed.

On the IC socket 31 which has a structure mentioned above and is mounted on the printed circuit board, an IC package 33 is accommodated.

That is, under the state where the cover member 49 of the pressing jig 38 is opened, the IC package 33 is inserted into the pressing jig body 48 and mounted on the tab film 35.

At this moment, the peripheral portion of the package body 33b of the IC package 33 is first guided by the guide surface 39b of the alignment plate 39 and then the IC package 33 is positioned at a predetermined position by the positioning surface 39c.

In addition, as shown in FIG. 4, each solder ball 33a is inserted into each solder ball opening 36a of the stopper 36 and the side surface portion of each solder ball 33a is positioned by the inner peripheral surface of each solder ball opening 36a. As mentioned above, positioning of the solder ball 33a by the stopper 36 and positioning by the alignment plate 39 can further improve the degree of positioning accuracy of the solder ball 33a with respect to the electrode pattern 35a of the tab film 35.

In this state, each solder ball 33a of the IC package 33 gets into contact with the electrode pattern 35a on the upper surface of the tab film 35.

Next, the cover member 49 of the pressing jig 38 is closed to make the latch member 60 of the cover member 49 engage with the engaged portion 48d of the pressing jig body 48. And finally the cover member 49 is completely closed. With these operations, the upper surface of the IC package body 33b of the IC package 33 is pressed by the push surface 54c of the pad 54, so that the elastic member 34c is elastically deformed. The electrode pattern 35a of the tab film 35 is pressed toward the solder ball 33a of the IC package 33 by the reactive force from the deformed elastic member 34. As a result of these movement, the electrode pattern 35a is pressed toward the solder ball 33a, to establish an electrical. connection between them.

Then the electrical connection between the IC package 33 and the printed circuit board can be completed through the tab film 35 and the contact pin 45. Especially when a plurality of solder balls 33a of the IC package 33 become narrower in their pitch, high precision in manufacturing a circuit pattern of the printed circuit board is required in case for establishing a direct electrical connection between the printed circuit board and the solder balls 33a, resulting in increase in the cost of the printed circuit board, at worst manufacturing itself becomes difficult. Therefore in the present invention, the conducting wire 35c is extended from the electrode pattern 35a at the central portion of the tab film to the peripheral portion of the tab film 35 to form the connecting electrodes 35b positioned at the peripheral portion. Thereby the pitch of the connecting electrode 35b can be made wider than that of the electrode pattern 35a. Therefore the pitch of the contact pin 45 of the base plate 34 and more specifically the pitch of each through hole of the printed circuit board can be made wider to a desired one, being convenient in manufacturing the printed circuit board.

According to the IC socket 31 mentioned above, plate like connecting electrodes 35b are provided on the under surface of the tab film 35, and the connecting electrode 35b is pressed to make a contact with the upper end contact portion 45b of the contact pin 45 provided to the base plate 34 as shown in FIG. 1 by the reactive force (elastic force) from the deformed elastic member 37 elastically deformed by being pressed by the pressing jig body 48. Therefore, there is no need to use a conventional round pin 14a or a pin type terminal 15b, which are shown in Prior Art FIGS. 10~12.

Accordingly narrower pitch of the contact pins 45 and downsizing of the whole set of the IC socket 11 can be realized. In addition, when compared with an IC socket having a pin type terminal 15b at a peripheral portion of the tab film 15, as shown in the Prior Art Figs., the socket and its parts of the embodiment of the present invention which has the plate-like connecting electrode 35b on the under surface of the tab film 35, can be produced at a lower cost.

Furthermore, the socket of the present invention has no need of such conventional process as fitting the round pin 14a to the pin type terminal 15b, because the connecting electrodes 35b only abut against the upper end contact portion 45b of the contact pin. Also in the present invention, the pressing jig 38, tab film 35 and base plate 34 are assembled and fixed by the bolts 41 and nuts 42, and the tab film 35 is only interposed between the pressing jig 38 and the base plate 34, therefore the tab film 35, the most vulnerable member, can be easily replaced with another one by only disassembling the bolts 41 and nuts 42.

Still further, the connecting electrodes 35b of the tab film 35 and the upper side contact portions 45b of the contact pins 45 are pressed to establish an electrical contact with each other by the reactive force (elastic force) of the elastic member 37 which is disposed between the base plate 34 and the pressing jig body 48 in an elastically deformed condition, so that the electrical connection between the connecting electrodes 35b and the contact pins can be surely maintained.

Even in a case where dimensional variation occurs in the parts of the socket such as contact pin 45, base plate 34 etc., the dimensional variation can be absorbed by the elastic deformation of the elastic member 37, so that the contact pressure between the connecting electrodes 35b and the upper side contact portions 45b can be maintained within an approximately constant level.

Further by changing the thickness (height in the vertical direction in FIG. 3) of the elastic member 37, contact pressure between the connecting electrodes 35b and the upper side contact portions 45b can be optionally changed to a desired level.

In addition, IC packages 33 having different sizes can be accommodated on the socket of the present invention by only replacing the alignment plate 39 and the pad 54 with ones which are in concert with the size of the IC packages 33.

A plurality of alignment plates 39 is previously provided and the size of the stepped portion 39a of the plurality of alignment plates 39 is not different from each other. Therefore, all alignment plates can be mounted on a single pressing jig body 48. The size of the inner opening, which is defined by the guide surface 39b of the inner peripheral portion and the positioning surface 39c, is formed to be different in concert with the size of the IC packages 33 having different diameters. These alignment plates 39 can be easily replaced with another one by making the stepped portion 39a engage and disengage with the pressing jig body 48.

Further a plurality of pads 54 are also provided previously. The size and the positional relationship of both concaves 54a and ellipsoidal openings 54b of all pads are designed to be constant, so that any pad can be attached to a single cover member 49. However, the size of the push surface 54c and the position of the tapered surface 54d are formed to be different in concert with the size of the IC package 33 and alignment plates 39, respectively. These pads 54 attached to the cover member 49 can be easily replaced with another one by mounting or dismounting the two axes 56.

Figure 10:
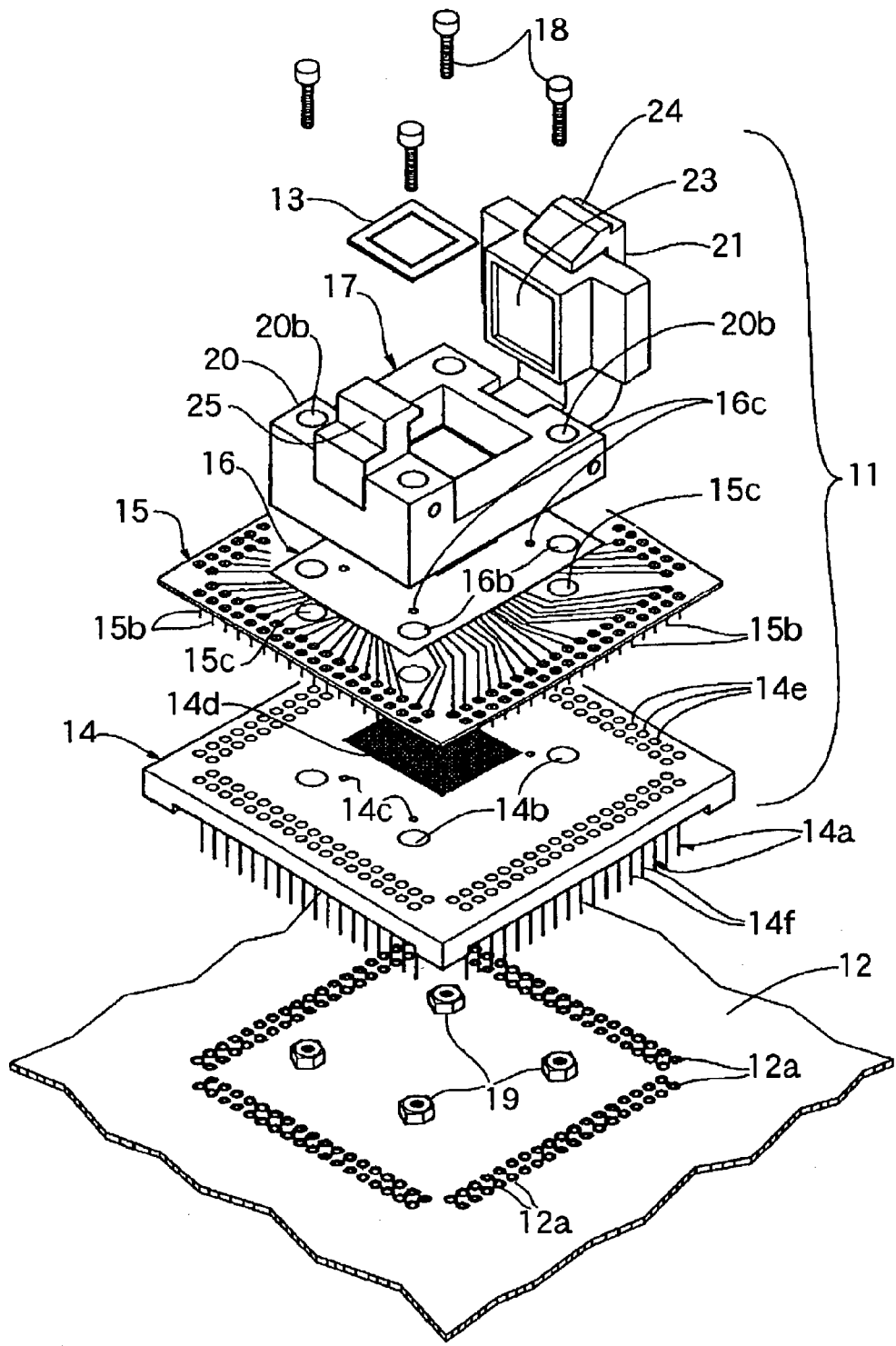
FIG. 10 is an exploded perspective view of a conventional IC socket.
Figure 11:
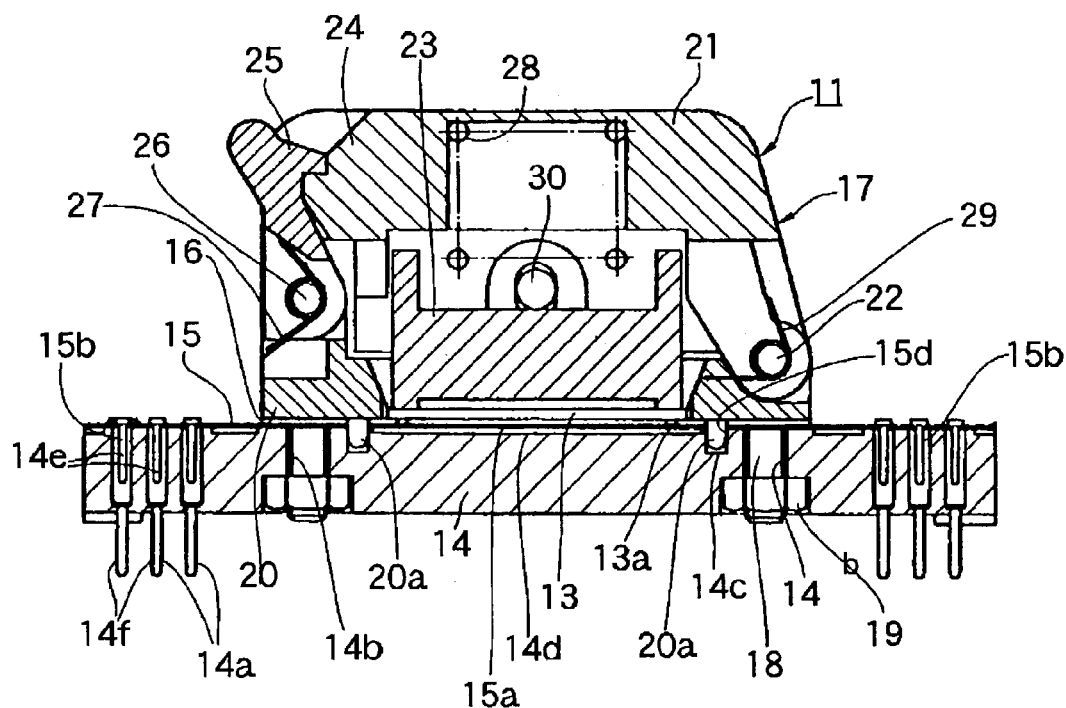
FIG. 11 is a sectional view of the conventional IC socket of FIG. 10.
Figure 12:
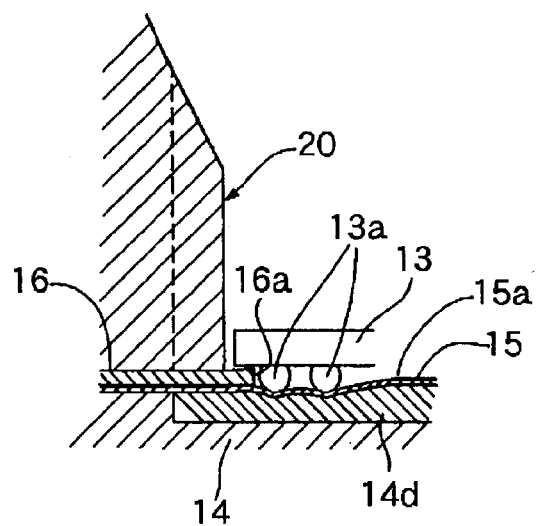
FIG. 12 is an enlarged view showing a connecting state between a solder ball of an IC package and a tab film of the conventional art.

Therefore, IC packages 33 having different sizes can be accommodated on the socket only by changing the alignment plate 39 and the pad 54, without changing whole set of big pressing jig 38 of the conventional art shown in FIGS. 10 to 12.

In addition, the alignment plate 39 has the guide surface 39b so that there is no need to guide the IC package 33 by the pressing jig body 48. In a case where the size of the positioning surface 39c is considerably smaller than that of the inner portion of the pressing jig body 48, the IC package 33 can be surely guided to the positioning surface 39c by the guide surface 39b of the alignment plate 39, because there is no need to guide the IC package 33 along the pressing jig body 48.

Further for the IC package having the solder ball 33a different in pitch or number, the socket of the present invention can be used for these IC packages by providing previously a plurality of tab films 35, which can be used for these IC packages having the solder balls 33a different in pitch or number of the solder ball and the outer dimension of the IC package as well.

Further, since the contact pin 45 is formed of an electro conductive plate through press working, forming of the contact pin 45 can be carried out easily and inexpensively. Further, the upper contact portion 45b of the contact pin 45 is formed to be a protruded arcuate shape at the central portion of the upper portion of the upper contact portion 45b, and the contact portion 45b is not sharp-edged, therefore the connecting electrode 35b of the tab film 35, on which the contact portion 45b abuts, can be prevented from being damaged. Further since the upper end contact portion 45b of the contact pin 45 is formed to be a protruded arcuate shape at the central portion of the upper portion of the upper contact portion 45b, and the central portion (a portion) is designed to abut against the connecting electrode 35b of the tab film 35, it is possible to realize a narrower pitch of the connecting electrode 35b and also it is possible to realize downsizing of the IC socket 31.

In other words, in a case where the upper end contact portion 45b is not formed to be an arcuate shape and has an approximately the same width or has a width wider than that of the connecting electrode 35b, there is a fear that short-circuit will occur if one upper end contact portion 45b comes into contact with another conducting wire 35c extended from another connecting electrode 35b adjacent to one connecting electrode to be connected with the one upper end contact portion 45b.

On the contrary in a case where the upper end contact portion 45b is formed to be an arcuate shape to make a portion of the central portion contact the connecting electrode 35b, there is no possibility of short-circuit between the one upper end contact portion 45b and another conducting wire 35c of another connecting electrode 35b adjacent to the one connecting electrode. Therefore, both narrowing of the pitch of the connecting electrode 35b and downsizing of the IC socket 31 can be realized.

When a contact area of the upper portion 45a of the contact pin is made smaller by reducing the width of the upper portion 45a with respect to the connecting electrode 35b, the strength of the upper portion 45a of the contact pin becomes undesirably deteriorated.

In the socket of the present invention as shown in FIG. 4, since the pad 54 presses the package body 33b of the IC package 33, and since the sheet-like stopper 36 is interposed between the under surface of the package body 33b and the tab film 35, over (or excessive) deformation or damage of the solder ball 33a can be prevented. And the solder ball 33a having different sizes can be used by changing the thickness of the sheet-like stopper.

Furthermore, the sheet-like stopper 36 has a plurality of solder ball openings 36a into each of which each solder ball 33a is inserted so that over deformation or damage of the solder ball 33a can be surely prevented.

Still further, the stopper 36 is formed of polyimide resin so that high precision processing etc. can be carried out using laser beam processing etc. The resin has heat resistance so that the socket of the present invention is preferably used for burn-in test etc. of the IC package 33. The resin also has high hardness so that the over deformation of the solder ball can be effectively prevented.

Further, the elastic member 34c having elasticity is provided at the under side of the electrode pattern 35a of the tab film 35, preventing the solder ball 33a of the IC package 33 from being deformed, therefore being able to ensure the electrical contact with the tab film 35.

Further, the solder balls 33a are each inserted into the solder ball openings 36a of the stopper 36 and are each positioned by the side surface portion of the solder ball 33a, so that the IC package 33 can be positioned more accurately.

In the embodiments mentioned above, the contact pin of the present invention is applied to an IC socket 31 having a base plate 34 and a tab film 35. But the present invention is not limited to the embodiments and can be applied to a socket body comprising an accommodation portion on which an IC package is accommodated. And a contact pin of the present invention having a contact portion can directly contact the terminal of the IC package.

In addition, in the embodiment mentioned above, a tab film 35 having flexibility is used as an "intermediate connector". But the present invention is not limited to the embodiments. Plate-like material having somewhat rigidity can also be used.

Further, in the embodiments mentioned above, the present invention is applied to what is called a clamshell type IC socket in which a cover member 49 is rotatably attached to a pressing jig body 48. But the present invention is not limited to the embodiments and can be applied to what is called an open-top type IC socket in which a cover member 49 is provided vertically movable with respect to a pressing jig body 48. In the open-top type IC socket, a pressing member for pressing the IC package is not provided on the cover member, but can be a latch member provided instead on the body and capable of moving between a press position where the latch member presses the IC package in concert with the vertical movement of the cover member, and a retired position where the IC package can be drawn off from the IC socket.

Further, in the embodiment mentioned above, a stopper 36 is formed of polyimide resin. But the present invention is not limited to the embodiments. The stopper can be, of course, formed of other members instead such as rubber sheet or gel-like sheet etc., so far as these members have a hardness enough to prevent the solder ball 33a from being over deformed or crushed, and an electrical insulative property and heat resistance as well. Further, in the embodiments, solder ball opening 36a, into each of which each solder ball 33a is inserted, are formed in the stopper 36. But the present invention is not limited to the embodiments. The opening may be formed, in the stopper 36, to be one into which a plurality of solder balls is designed to be inserted together into the opening.

Further, in the embodiments the present invention is applied to an IC socket having the base plate 34 and the tab film 35 etc. But the present invention is not limited to the embodiments but can, of course, be applied to other type of IC sockets.

The invention claimed is:

1. A plate-like shaped contact pin extending in a straight direction, which is made of an electroconductive plate comprising an upper portion, a lower portion and an upper contact portion formed at an upper edge portion of the upper portion, a width of the upper portion being wider than the lower portion, the lower portion extending straight downward from a lower edge portion of the upper portion, and a width of the lower portion being approximately the same along the entire length of the lower portion, the upper contact portion being designed to electrically connect a part and having a central portion protruded to be an arcuate shape which bridges an approximately entire width of the upper portion, the central portion being designed to abut against the part to establish an electrical connection between the central portion and the part.

2. A socket for an electrical part comprising:
an electrical insulating member having a first and a second surface;
the contact pin according to claim 1; and
the contact pin further comprising a lead portion,
wherein the contact pin being provided to the electrical insulating member, the upper contact portion of the contact pin being protruded from the first surface of the electrical insulating member, the lead portion of the contact pin being protruded from the second surface of the electrical insulating member and designed to establish an electrical connection between the lead portion and a printed circuit board.

3. A socket for an electrical part comprising:
the contact pin according to claim 1;
a base, to which the contact pin is provided;
an intermediate connector, provided on the base, for establishing an electrical connection between a terminal of the electrical part and the contact pin, the intermediate connector having a connecting electrode, on a first surface of the intermediate connector, for establishing an electrical connection with the upper contact portion of the contact pin;
a body provided on the intermediate connector; and
a fixing means for fixing the base, the intermediate connector and the body,
wherein at the time the base, the intermediate connector and the body are fixed together by the fixing means, the connecting electrode and the upper contact portion of the contact pin are elastically abutted with each other.

4. A socket for an electrical part comprising:
a socket body in which an electrical part is accommodated; and
the contact pin according to claim 1, provided in the socket body,
wherein the upper contact portion of the contact pin is designed to abut against a terminal of the electrical part.

5. A socket for an electrical part comprising:
a base;
a connecting member provided to the base;
an intermediate connector provided on the base for establishing electrical connection between a terminal of the electrical part and the connecting member;
a body detachably provided on the intermediate connector with respect to the base; and an alignment member detachably engaged with the body and formed at a central portion thereof into which the electrical part is accommodated, wherein a plurality of alignment members are previously prepared and used interchangeably in accordance with a dimension of an outer diameter of an electrical part to be tested.

6. The socket for an electrical part according to claim 5, further comprising:

a slanted guide surface provided on an upper portion of an opening portion of the alignment member, the slanted guide surface being designed to guide the electrical part; and a positioning surface provided on a lower portion continuously downward from the guide surface for positioning the electrical part.

7. The socket for an electrical part according to claim 5, further comprising:

a cover member detachably attached to an end portion of the body; and a press member detachably provided to the cover member, the press member having a press surface for pressing the electrical part, wherein a plurality of press members are previously prepared and can be used interchangeably in accordance with a dimension of an outer diameter of the electrical part.

8. The socket for an electrical part according to claim 7, further comprising:

a slanted guide surface provided on an upper portion of an opening portion of the alignment member, the slanted guide surface being designed to guide the electrical part; and a positioning surface provided on a lower portion continuously downward from the guide surface for positioning the electrical part.

9. A socket for an electrical part comprising:

an accommodation surface on which the electrical part having terminals on a first surface of a body of the part is accommodated;

a contact terminal disposed on the accommodation surface, which is designed to contact the terminal of the electrical part;

a press member for pressing the electrical part placed on the accommodation surface to establish an electrical connection between the terminal of the electrical part and the contact terminal; and an electrically insulating stopper interposed between the first surface of the electrical part and the accommodation surface, wherein the stopper limits the deformation of the terminal when the press member presses the electrical part.

10. The socket for an electrical part according to claim 9, wherein the stopper limits the deformation of the terminal by making an upper surface of the stopper abut on the first surface of the body of the electrical part while a lower surface of the stopper abuts on the accommodation surface when the press member presses the electrical part.

11. The socket for an electrical part according to claim 9, wherein the stopper is formed to be a sheet-like shape, and a plurality of openings, into which the terminal of the electrical part is inserted, is provided to the stopper.

12. The socket for an electrical part according to claim 11, wherein the stopper limits the deformation of the terminal by making an upper surface of the stopper abut on the first surface of the body of the electrical part while a lower surface of the stopper abuts on the accommodation surface when the press member presses the electrical part.

13. The socket for an electrical part according to claim 9, wherein the accommodation surface is a surface of a sheet-like connector on which an electrode pattern is provided as the contact terminal, and the stopper is interposed between the connector and the first surface of the electrical part.

14. The socket for an electrical part according to claim 13, wherein the stopper limits the deformation of the terminal by making an upper surface of the stopper abut on the first surface of the body of the electrical part while a lower surface of the stopper abuts on the accommodation surface when the press member presses the electrical part.

15. The socket for an electrical part according to claim 13, wherein the stopper is made of polyimide resin.

16. The socket for an electrical part according to claim 13, wherein the electrical part is a BGA package and the terminal is a solder ball.

17. The socket for an electrical part according to claim 9, wherein the stopper is made of polyimide resin.

18. The socket for an electrical part according to claim 17, wherein the stopper limits the deformation of the terminal by making an upper surface of the stopper abut on the first surface of the body of the electrical part while a lower surface of the stopper abuts on the accommodation surface when the press member presses the electrical part.

19. The socket for an electrical part according to claim 11, wherein an opening of the sheet-like stopper controls a side surface portion of the terminal.

20. The socket for an electrical part according to claim 19, wherein the stopper limits the deformation of the terminal by making an upper surface of the stopper abut on the first surface of the body of the electrical part while a lower surface of the stopper abuts on the accommodation surface when the press member presses the electrical part.

21. The socket for an electrical part according to claim 9, wherein the electrical part is a BGA package and the terminal is a solder ball.

22. The socket for an electrical part according to claim 21, wherein the stopper limits the deformation of the terminal by making an upper surface of the stopper abut on the first surface of the body of the electrical part while a lower surface of the stopper abuts on the accommodation surface when the press member presses the electrical part.

23. The socket for an electrical part according to claim 13, wherein the stopper is formed to be a sheet-like shape, and a plurality of openings, into which the terminal of the electrical part is inserted, is provided to the stopper.

24. The socket for an electrical part according to claim 23, wherein an opening of the stopper controls a side surface portion of the terminal.

25. An apparatus comprising:

a plate-like shaped contact pin extending in a straight direction, which is made of an electroconductive plate having an upper portion, a lower portion and an upper contact portion formed at an upper end portion of the upper portion, a width of the upper portion being wider than the lower portion, the lower portion extending straight downward from a lower edge portion of the upper portion, and a width of the lower portion being approximately the same along the entire length of the lower portion, the upper contact portion having a central portion protruding in an arcuate shape which bridges an approximately entire width of the upper portion, the central portion being designed to abut against an electrical part to thereby establish a electrical connection between the central portion and the electrical part.

26. An apparatus as in claim 25, further comprising an electrical insulating member having first and second surfaces, wherein
the contact pin further comprises a lead portion, and
the upper contact portion of the contact pin protrudes from the first surface of the electrical insulating member, the lead portion of the contact pin protruding from the second surface of the electrical insulating member and establishing an electrical connection between the lead portion and a printed circuit board.

27. An apparatus as in claim 25, further comprising:
a base, to which the contact pin is provided;
an intermediate connector, provided on the base, for establishing an electrical connection between a terminal of the electrical part and the contact pin, the intermediate connector having a connecting electrode, on a first surface of the intermediate connector, for establishing an electrical connection with the upper contact portion of the contact pin; and
a body provided on the intermediate connector,
wherein the base, the intermediate connector and the body are fixed together with the connecting electrode and the upper contact portion of the contact pin elastically abutted with each other.

28. An apparatus as in claim 25, further comprising:
a socket body in which the contact pin is provided and in which the electrical part is accommodated, wherein the central portion of the contact pin abuts against a terminal of the electrical part.

29. A socket for an electrical part comprising:
a contact pin made of a plate-like shaped electroconductive plate comprising a contact portion formed at a first end edge portion of the plate, the contact portion being designed to electrically connect a part and having a central portion protruded to be an arcuate shape, the central portion being designed to abut against the part to establish an electrical connection between the central portion and the part;
a base, to which the contact pin is provided;
an intermediate connector, provided on the base, for establishing an electrical connection between a terminal of the electrical part and the contact pin, the intermediate connector having a connecting electrode, on a first surface of the intermediate connector, for establishing an electrical connection with a contact portion of the contact pin;
a body provided on the intermediate connector; and
a fixing means for fixing the base, the intermediate connector and the body,
wherein at the time the base, the intermediate connector and the body are fixed together by the fixing means, the connecting electrode and the contact portion of the contact pin are elastically abutted with each other.

30. An apparatus comprising:
a contact pin made of a plate-liked shaped electroconductive plate having a contact portion formed at an end edge portion of the plate, the contact portion having a central portion protruding in an arcuate shape, the central portion being designed to abut against an electrical part to thereby establish a electrical connection between the central portion and the electrical part;
a base, to which the contact pin is provided;
an intermediate connector, provided on the base, for establishing an electrical connection between a terminal of the electrical part and the contact pin, the intermediate connector having a connecting electrode, on a first surface of the intermediate connector, for establishing an electrical connection with a contact portion of the contact pin; and
a body provided on the intermediate connector,
wherein the base, the intermediate connector and the body are fixed together with the connecting electrode and the contact portion of the contact pin elastically abutted with each other.

31. A socket for an electrical part comprising:
an electrical insulating member having a first and a second surface;
a plate-like shaped contact pin extending in a straight direction, which is made of an electroconductive plate comprising an upper portion, a lower portion and an upper contact portion formed at an upper edge portion of the upper portion, a width of the upper portion being wider than the lower portion, the upper contact portion being designed to electrically connect a part and having a central portion protruded to be an arcuate shape which bridges an approximately entire width of the upper portion, the central portion being designed to abut against the part to establish an electrical connection between the central portion and the part,
the contact pin further comprising a lead portion, and
wherein the contact pin is provided to the electrical insulating member, the upper contact portion of the contact pin being protruded from the first surface of the electrical insulating member, the lead portion of the contact pin being protruded from the second surface of the electrical insulating member and designed to establish an electrical connection between the lead portion and a printed circuit board.

32. A socket for an electrical part comprising:
a plate-like shaped contact pin extending in a straight direction, which is made of an electroconductive plate comprising an upper portion, a lower portion and an upper contact portion formed at an upper edge portion of the upper portion, a width of the upper portion being wider than the lower portion, the upper contact portion being designed to electrically connect a part and having a central portion protruded to be an arcuate shape which bridges an approximately entire width of the upper portion, the central portion being designed to abut against the part to establish an electrical connection between the central portion and the part;
a base, to which the contact pin is provided;
an intermediate connector, provided on the base, for establishing an electrical connection between a terminal of the electrical part and the contact pin, the intermediate connector having a connecting electrode, on a first surface of the intermediate connector, for establishing an electrical connection with the upper contact portion of the contact pin;
a body provided on the intermediate connector; and
a fixing means for fixing the base, the intermediate connector and the body,
wherein at the time the base, the intermediate connector and the body are fixed together by the fixing means, the connecting electrode and the upper contact portion of the contact pin are elastically abutted with each other.

33. An apparatus comprising:
a plate-like shaped contact pin extending in a straight direction, which is made of an electroconductive plate having an upper portion, a lower portion and an upper contact portion formed at an upper end portion of the upper portion, a width of the upper portion being wider than the lower portion, the upper contact portion having a central portion protruding in an arcuate shape which bridges an approximately entire width of the upper portion, the central portion being designed to abut against an electrical part to thereby establish a electrical connection between the central portion and the electrical part; and an electrical insulating member having first and second surfaces, wherein the contact pin further comprises a lead portion, and the upper contact portion of the contact pin protrudes from the first surface of the electrical insulating member, the lead portion of the contact pin protruding from the second surface of the electrical insulating member and establishing an electrical connection between the lead portion and a printed circuit board.

34. An apparatus comprising:

a plate-like shaped contact pin extending in a straight direction, which is made of an electroconductive plate having an upper portion, a lower portion and an upper contact portion formed at an upper end portion of the upper portion, a width of the upper portion being wider than the lower portion, the upper contact portion having a central portion protruding in an arcuate shape which bridges an approximately entire width of the upper portion, the central portion being designed to abut against an electrical part to thereby establish a electrical connection between the central portion and the electrical part;

a base, to which the contact pin is provided;

an intermediate connector, provided on the base, for establishing an electrical connection between a terminal of the electrical part and the contact pin, the intermediate connector having a connecting electrode, on a first surface of the intermediate connector, for establishing an electrical connection with the upper contact portion of the contact pin; and a body provided on the intermediate connector, wherein the base, the intermediate connector and the body are fixed together with the connecting electrode and the upper contact portion of the contact pin elastically abutted with each other.

* * * * *

UNITED STATES PATENT AND TRADEMARK OFFICE
CERTIFICATE OF CORRECTION

| | | |
|---|---|---|
| PATENT NO. | : 7,077,665 B2 | Page 1 of 1 |
| APPLICATION NO. | : 10/390668 | |
| DATED | : July 18, 2006 | |
| INVENTOR(S) | : Hokuto Kanesashi | |

It is certified that error appears in the above-identified patent and that said Letters Patent is hereby corrected as shown below:

First Page, Col. 2, Abstract, line 8, delete "en" and insert --an-- therefor.

Signed and Sealed this

Nineteenth Day of December, 2006

JON W. DUDAS
*Director of the United States Patent and Trademark Office*